United States Patent [19]

Dydyk

[11] 4,316,160

[45] Feb. 16, 1982

[54] IMPEDANCE TRANSFORMING HYBRID RING

[75] Inventor: Michael Dydyk, Scottsdale, Ariz.

[73] Assignee: Motorola Inc., Schaumburg, Ill.

[21] Appl. No.: 173,239

[22] Filed: Jul. 28, 1980

[51] Int. Cl.[3] .......... H01P 5/22; H03F 3/60

[52] U.S. Cl. .......... 333/120; 330/287; 330/295; 333/161

[58] Field of Search .......... 333/120, 127, 128; 330/286, 287, 295

[56] References Cited

U.S. PATENT DOCUMENTS

| | | | |
|---|---|---|---|
| 2,698,381 | 12/1954 | Harvie | 333/120 X |
| 2,847,517 | 8/1958 | Small | 333/120 X |
| 2,874,276 | 2/1959 | Dukes et al. | 333/120 X |

OTHER PUBLICATIONS

Pon, *Hybrid-Ring Directional Coupler for Arbitrary Power Divisions*, IRE Trans. on MTT, Nov. 1961, pp. 529-534.

*Primary Examiner*—Paul L. Gensler

*Attorney, Agent, or Firm*—M. David Shapiro; Eugene A. Parsons

[57] ABSTRACT

An impedance transforming hybrid ring has a non-uniform impedance ring structure coupled to four ports. Two of the ports function as input ports, the remaining two as output ports. An arbitrary relationship exists between the impedance of the input ports and the impedance of the output ports. The power division between output ports may be selected as a matter of design choice. A broad band phase reversing network is utilized to provide an impedance transforming hybrid ring which efficiently operates over octave bandwidths. Design equations are provided and method for utilizing same are disclosed.

12 Claims, 7 Drawing Figures

IMPEDANCE TRANSFORMING HYBRID RING

BACKGROUND

1. Field of the Invention

The invention relates to hybrid rings, that is, hybrid junctions consisting of a waveguide or transmission line forming a closed ring into which lead four guides or lines appropriately spaced around the circle. In particular the invention relates to a hybrid ring in which the ring impedances are a function of both load impedances at input and output of the device as well as the power division ratio at the two output ports of the hybrid ring.

2. Prior Art

Hybrid rings are well known in the prior art and are defined in ANSI/IEEE Std 100–1977 American National Standard, approved May 12, 1978, American National Standards Institute, wherein the definition of a hybrid junction may also be found set forth as, "a waveguide or transmission line arrangement with four ports which, when the ports have reflectionless terminations, has the property that energy entering any one port is transferred (usually equally) to two of the remaining three." References cited frequently with regard to hybrid ring structures are U.S. Pat. No. 2,445,895, to W. A. Tyrrell, issued July 27, 1978, as well as Tyrrell's paper entitled "Hybrid Circuits for Microwaves", published in the November 1947 issue of the Proceedings of the IRE.

W. D. Lewis in U.S. Pat. No. 2,639,325, issued May 19, 1953, notes that an inconvenient feature of the prior art hybrid rings (referring particularly to FIGS. 12 and 37 of the Tyrrell patent) is the fact that the impedances required for the four circuits to be coupled to the four terminals of the hybrid ring structure, respectively, differ from terminal to terminal. Lewis then discloses a hybrid ring in which the ring impedance is uniform and the four output terminals are matched to a single load impedance. He achieves this end by spacing the four terminal ports around the ring structure so as to obtain a match between the port load impedances and the uniform impedance of the ring.

By its very nature, the hybrid ring is a frequency sensitive device. This is true because its proper functioning is dependent upon the electrical path length about the ring structure as well as the length of the electrical path separating the four ports coupled to the ring structure. Those skilled in the art have been active in attempting to increase the effective operating bandwidth of hybrid ring devices.

The ring hybrid depends in general upon a ring structure whose electrical and physical path length are each equal to one and one-half wavelengths at the design frequency. Hylas in U.S. Pat. No. 2,735,986, issued Feb. 21, 1956 provides a broad band hybrid ring network by reducing the physical path length of the ring to one wavelength at the design frequency while maintaining the electrical path length about the ring structure at the required one and one-half wavelengths. This is accomplished by structuring the ring of a two conductor transmission line and transposing the conductors at a point between two of the terminals connected to the ring structure. This transposition of conductors effectively introduces a frequency insensitive 180° phase shift. Such frequency insensitivity naturally increases the operating bandwidth of the device. Hylas makes further improvements in the effective bandwidth performance of the device by impedance matching at the junction at which the ports are coupled to the ring structure.

Cappucci in U.S. Pat. No. 3,504,304, issued Mar. 31, 1970, characterizes prior art hybrids such as those disclosed by Hylas as "... devices which provide the required isolation between conjugate junctions only over a relatively narrow frequency band of signals applied to the input." Cappucci then discloses a hybrid ring which utilizes the conductor transposition of Hylas but further includes compensating circuits having the reactive portion of their impedances variable between inductive and capacitive reactances over the operating range of the hybrid ring. This is accomplished by the use of a series resonant circuit connected to each of the four junctions of the ring structure. The effect is stated as increasing the operating bandwidth and/or decreasing the input voltage standing wave ratio (VSWR).

Budenbom has several patents concerning the broadband operation of hybrid rings. In U.S. Pat. No. 2,784,381, issued Mar. 5, 1957 hybrid structures having greater than four arms are disclosed in a coupling arrangement stated to yield an increased useful frequency range of operation. A hybrid ring having a given number of branch taps or arms is connected in tandem with two or more hybrid rings having a greater number of branch arms or taps in such a manner as to merely add logrithmically the attenuations obtainable between conjugate taps or arms of the several hybrid ring structures. In U.S. Pat. No. 3,010,081, issued Nov. 21, 1961, there is disclosed two similar four-arm hybrid rings connected in parallel, with the connections to one ring having a mirror image relationship with respect to the connections of the other. The output of the two hybrid rings is combined in a third ring. It is stated that the frequency range over which the balance is high is greatly increased because an unbalanced voltage developed in one ring, as the frequency is changed, is cancelled by an equal unbalanced voltage of opposite polarity developed in the other ring. In U.S. Pat. No. 2,959,751, issued Nov. 8, 1960, phase compensation is provided to offset the frequency sensitivity of the path lengths within the ring structure. The phase compensation is to provide an essentially frequency insensitive half-wavelength path difference in the two path lengths between input port and difference output port.

A promising phase reversal network has been diclosed by Steven March, in a paper entitled, "A Wide Band Strip Line Hybrid Ring", IEEE Trans., Volume MTT-16, page 361, (June 1968). March replaces the three quarter wavelength line section of the conventional hybrid ring with a pair of equilaterial, broad side coupled, quarter wavelength segments of transmission line having a pair of diameterically opposed ends short circuited. This quarter wavelength network provides phase reversal over a wide frequency band. Use of such a phase reversing network reduces the overall size of the hybrid ring structure.

Size has always been a drawback in the use of hybrid ring structures. This is further complicated by the necessity of providing transformer networks to match the impedance of such devices as transistors, Gunn diode amplifiers and oscillators depending upon the choice of device employed with the hybrid ring port loading impedances may have to be matched to impedances in the 5 to 100 ohm range. The necessity of providing transformer networks between the hybrid ring and such active devices generally increases the overall length, weight, and cost of the package and increases insertion loss of the overall device.

It is therefore seen that an unfulfilled need exists for a hybrid ring network which will inherently perform the necessary impedance transformation to match the hybrid ring and the active devices associated with it. A branch-line hybrid having such inherent impedance transformation characteristics has been disclosed by Chen Y. Ho in his paper, "Transform Impedance With a Branch-Line Coupler", Microwaves, Volume 15, pages 47-52, (May 1976). Application of Ho's approach however produces a narrow bandwidth device (approximately 10 percent). For wider bandwidth operation, those skilled in the art at this present time must resort to the conventional use of external transformer matching networks and a broader bandwidth coupler such as a ring hybrid coupler with its 26 percent bandwidth or the coupled-line coupler with its octave bandwidth capabilities.

It is therefore an objective of the invention to provide a hybrid ring having inherent impedance transformation characteristics to permit matching of the impedance of the ring structure to that of an external device.

It is a further objective of the invention to provide a hybrid ring structure having inherent impedance transformation characteristics capable of matching the ring structure to external load impedances wherein the input port load impedances differ from the output port load impedances.

It is another objective of the invention to provide a hybrid ring structure with inherent impedance transformation characteristics having a useful operating bandwidth at least equivalent to that of prior art non-impedance-transforming hybrid rings.

It is a more particular objective of the invention to provide a hybrid ring having inherent impedance transforming characteristics which is capable of useful operation over octave bandwidths.

It is a specific object of the invention to provide an impedance transforming hybrid ring wherein the ring impedances are established as a function of both input and output load impedance characteristics as well as of the power division ratio at the two output ports of the hydrid ring.

SUMMARY OF THE INVENTION

The invention provides means and method for providing an impedance matching hybrid ring having a selectable power division ratio between output ports. The ring itself is a non-uniform impedance structure. Two input and two output ports are coupled to said non-uniform impedance ring. The load impedance of the input ports may be less than, equal to, or greater than the load impedance of the output ports. Equations are derived for establishing the characteristic admittances of the ring structure between any two given ports coupled thereto. By use of these equations a hybrid ring having inherent impedance transformation characteristics to match the ring structure to the external loads will be derived. The useful bandwidth of the device is equivalent to that of prior art non-impedance transforming hybrid rings. The invention discloses further, the use of quarter-wavelength coupled, short circuited line segments to achieve a near ideal phase reversal network and to extend the useful frequency range of the device to octave bandwidths. Additional equations are disclosed permitting the design and incorporation of such an ideal phase reversal network while retaining the inherent impedance transformation characteristics of the invention.

The various objectives of the invention as set forth heretofore and in the foregoing Summary of the Invention will be more clearly delineated in the description which follows and the accompanying drawings.

DETAILED DESCRIPTION OF THE INVENTION

Figure 1:
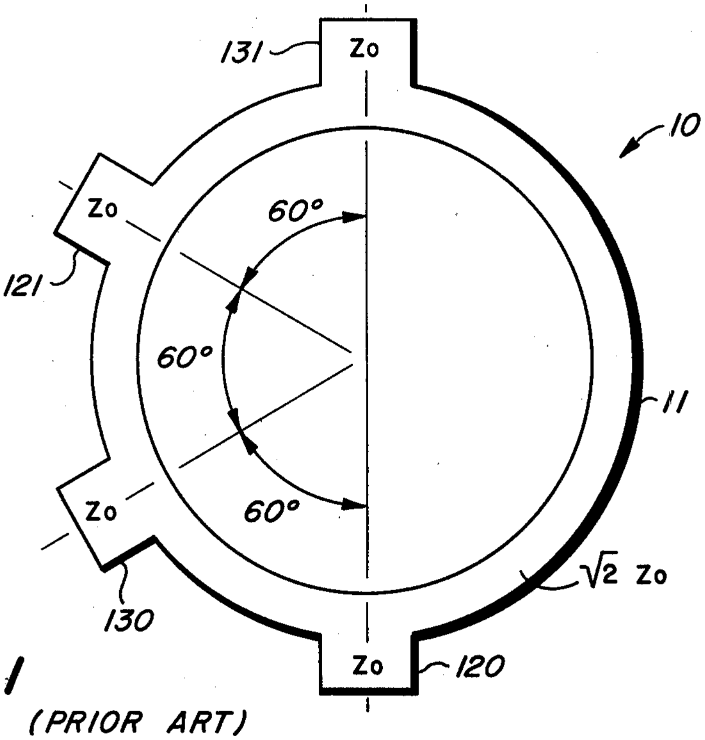
FIG. 1 (PRIOR ART)
FIG. 1 illustrates a conventional hybrid ring structure.

That hybrid rings are well known in the prior art has been noted in the Background discussion. FIG. 1 illustrates a typical prior art hybrid ring in a strip transmission line configuration. The hybrid ring 10 is comprised of a ring structure 11 which is seen, by its uniform width, to have a uniform impedance throughout. As is typical of prior art devices, hybrid ring 10 is provided with two input ports 120 and 121 and two output ports 130 and 131. Hybrid ring 10 is essentially a reciprocal device in that the ports designated as input ports 120 and 121 might just as conveniently have been designated as output ports, while ports 130 and 131 could just as conveniently be denoted input ports. The electrical path length around ring structure 11 is typically one and one-half wavelengths long. Each port is located such that the nearest adjacent port is 60 mechanical degrees displaced one from the other. The 60 mechanical degrees separating near-adjacent ports corresponds to an electrical path length of one quarter wavelength along ring structure 11 at the design frequency.

A signal entering any one port, for example input port 120, will have a portion of the signal travel clockwise around ring structure 11 toward output port 130. An equal portion will travel counter clockwise around ring structure 11 and arrive at output port 130 via a path length which causes each portion of the signal arriving at output port 130 to be in-phase with each other. Thus a signal will be output from port 130. Similarly signals arriving at port 131 from input port 120 will likewise arrive in a phase relationship which permits the signal portions to sum and provide an output signal at port 131. In a conventional hybrid ring structure 10 one-half of the power delivered to input port 120 will be delivered out of output port 130. The remaining half of the power is delivered out of port 131. However, it should be noted that the signal out of port 130 will differ in phase from the signal output of port 131 by 180° or one-half wavelength. Thus in attempting to use the device as a reciprocal device, if equal in-phase signals were injected into ports 130 and 131 they would cancel at the output of port 120.

Assume now that a signal is injected into port 121. Equal signals will be output ports 130 and 131, which signals will be in-phase with each other. Now, in attempting to use hybrid ring 10 as a reciprocal device, if equal amplitude equi-phase signals are injected into ports 130 and 131, these signals will sum at the output of port 121. Ports 120 and 121 as well as ports 130 and 131 are conjugate ports and an analysis of the path length differences between them will indicate that a signal injected into either one port of a conjugate path will result in a null output at the other port of the conjugate pair. Thus, ideally, a signal injected into port 120 will result in no output from port 121, and vice versa.

As is usual in a conventional hybrid ring such as that illustrated in FIG. 1 each port is matched to an equivalent load impedance $Z_o$. The impedance of the ring structure is uniform throughout, having a value equivalent to $\sqrt{2}Z_o$. The division ratio of power output ports 130 and 131 is 1:1 or unity.

Figure 2:
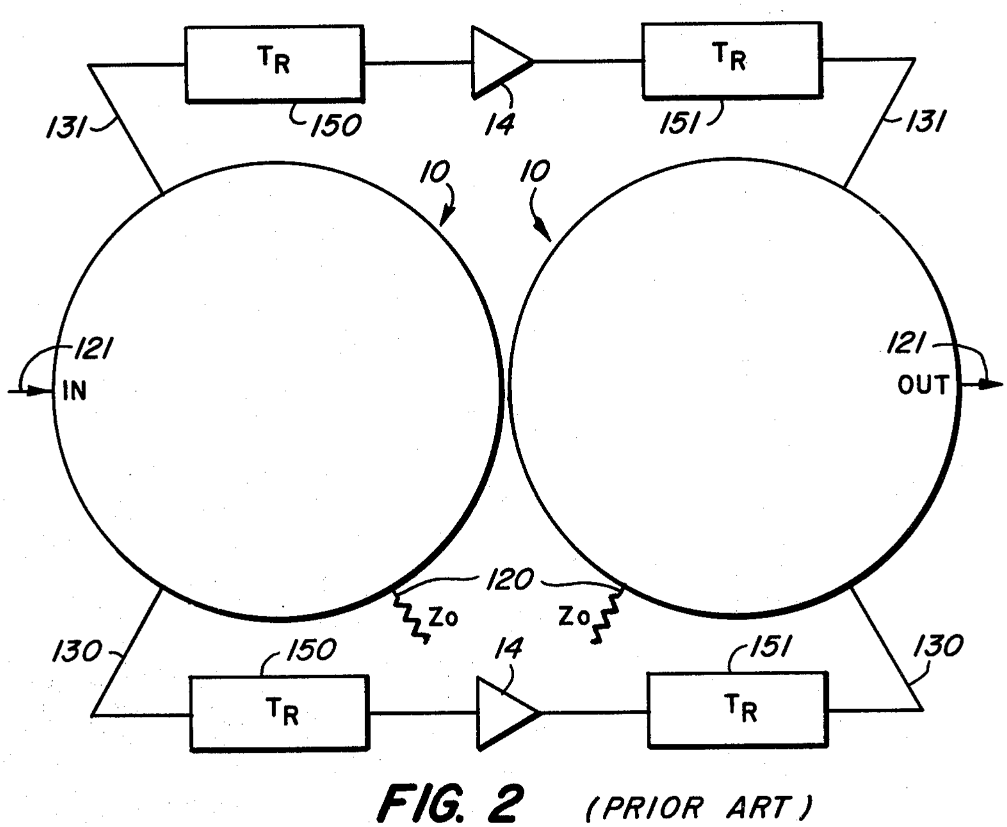
FIG. 2 (PRIOR ART)
FIG. 2 schematically illustrates the use of two conventional hybrid rings in a transistor combining application. Note the requirement for impedance transformations at both the input and output of the transistor device.

Because the four ports of the prior art hybrid are designed to operate into a common characteristic impedance $Z_o$ it is necessary that some form of impedance transforming network be provided at the input or output ports of the conventional hybrid when a device, such as a transistor, or other active device, is used in association with hybrid ring 10. FIG. 2 illustrates the manner in which a conventional hybrid ring 10 is used to divide an input signal equally, each portion to be amplified by transistors 14. The amplified output of transistors 14 is combined in a second hybrid ring 10 to provide a sum signal output whose magnitude may be greater than that of a signal which either transistor 14 alone may safely be capable of outputting.

Remembering the manner in which a conventional ring operates, as earlier discussed, a signal input to port 121 of left-hand hybrid ring 10 will result in equal magnitude equi-phase signals being output ports 130 and 131. A null results at port 120 and this port is terminated in a load $Z_o$. Since it is unlikely that transistors 14 will have the same characteristic impedance as that presented at output ports 130 and 131 of hybrid ring 10, an impedance transforming device 150 will be necessary to match the impedance of these ports to the input of transistors 14. For optimum performance such an impedance transforming device may be several quarter wavelengths long. The amplified signal output by each of transistors 14 is fed respectively to ports 130 and 131 of right-hand hybrid ring 10. With ports 130 and 131 now acting as input ports a sum signal output will appear at port 121 and a null signal will appear at port 120 which is terminated in a characteristic impedance load $Z_o$. As before, the output impedance of transistors 14 is not likely to match the input impedance of ports 131 and 130 of the right-hand hybrid 10. Thus, additional impedance transformation networks 151 are required.

The need for impedance transforming networks 150 and 151 in the transistor combining network of FIG. 2 tend to increase the size of the package, complicate the design, and increase the overall cost. The need for an impedance transforming hybrid ring and the advantages to be gained therefrom are readily apparent.

Figure 3:
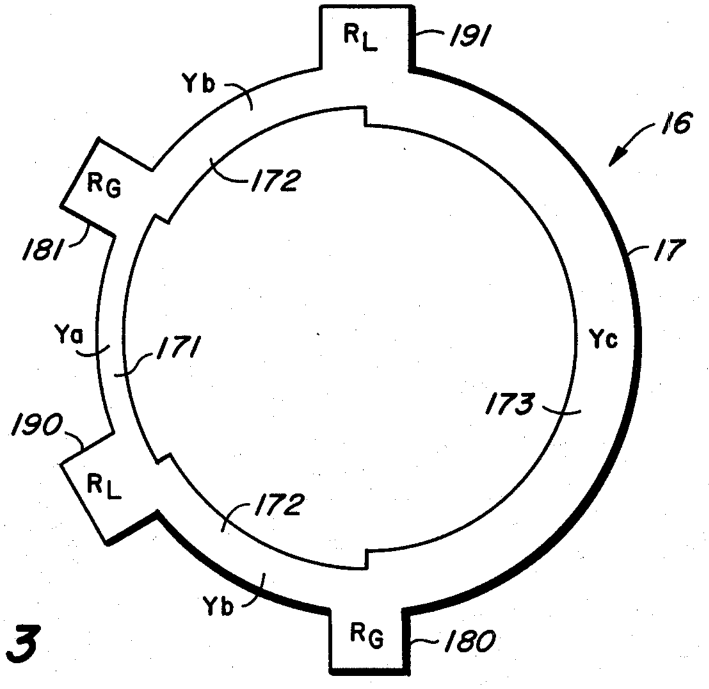
FIG. 3 illustrates the invention, a hybrid ring having inherent impedance transformation characteristics.

To respond to the need for an impedance transforming hybrid ring, the structure of hybrid ring 16, illustrated in FIG. 3, was conceived. It was believed that a non-uniform impedance ring structure 17 would permit input ports 180 and 181 to be matched to the impedance of the generating source of the incoming signals, while output ports 190 and 191 could be matched to a different load impedance equal to that of the device or circuitry coupled to these output ports. To confirm the concept, the odd/even mode, symmetry analysis of Reed and Wheeler was applied. Reference J. Reed and G. J. Wheeler, "A Method of Analysis of Symmetrical Four-Port Networks," IRE Transactions, Volume MTT-4, pages 246–252, October, 1956. An exposition of this method of analysis may also be found in J. L. Altman, "Microwave Circuits" D. Van Nostrand Company Incorporated, Chapter 4, 1964.

The ring structure of impedance transforming hybrid ring 16 is seen to comprise a quarter wavelength section 171 of characteristic admittance Ya, two sections 172 each a quarter wavelength long and of characteristic admittance Yb, and a third segment 173, three quarters of a wavelength long of characteristic admittance Yc. The input ports 180 and 181 are matched to an impedance Rg while the output ports 190 and 191 are matched to an impedance $R_L$. In the analysis which follows, Rg and $R_L$ are considered to be non-equal impedances. The odd/even mode symmetry analysis will be performed about a plane of symmetry which passes through the center of hybrid ring 16 and bisects ring segment 171. When this is done the equivalent circuit of FIG. 4 results.

Figure 4:
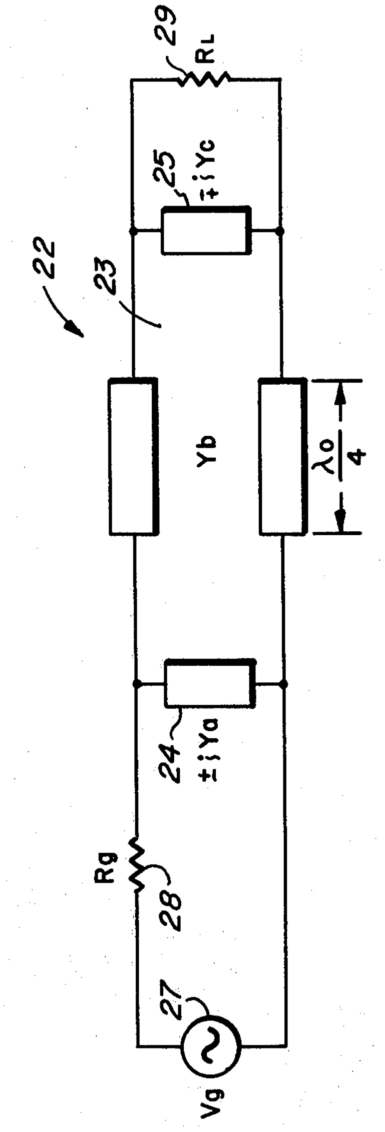
FIG. 4 is a schematic representation of the invention of FIG. 3 resulting from the application of odd/even mode symmetry analysis.

The equivalent circuit 22 of FIG. 4 indicates a quarter wavelength section of transmission line 23 of characteristic admittance Yb across whose input is presented the shunt combination of transmission line section 24 of admittance ±iYa and a signal generator 27 having an internal load impedance 28 equivalent to Rg. The output of transmission line section 23 is coupled to the shunt combination of transmission line 25 of characteristic impedance ±iYc and load impedance 29 equivalent to $R_L$. The signs (+) and (−) preceeding admittances Ya and Yc designate the even (+) and odd (−) mode excitation.

The ABCD matrix which derives from the combination of both even and odd mode excitations is $$\begin{bmatrix} A & B \\ C & D \end{bmatrix} = \begin{bmatrix} \pm Yc/Yb & i/Yb \\ i(Yb + YaYc/Yb) & \mp Ya/Yb \end{bmatrix} \tag{1}$$

From the ABCD matrix of equation (1) the reflection coefficient (Γ) and the transmission coefficient (τ) are derived as follows:

$$\Gamma = \frac{AR_L + B - R_LRgC - RgD}{AR_L + B + R_LRgC + RgD} \tag{2}$$

$$\tau = \frac{2\sqrt{R_LRg}}{AR_L + B + R_LRgC + RgD} \tag{3}$$

The vector amplitudes (E) of the signals emerging from the four ports may be defined as:

$$E_{181} = \tfrac{1}{2}(\Gamma e - \Gamma o) \tag{4}$$

$$E_{191} = \tfrac{1}{2}(\tau e + \tau o) \tag{5}$$

$$E_{180}=\tfrac{1}{2}(\Gamma e-\Gamma o) \quad (6)$$

and $$E_{190}=\tfrac{1}{2}(\Gamma e+\Gamma o) \quad (7)$$

where the subscript e represents even mode coefficients and the subscript o represents odd mode coefficients.

For optimum performance it is important that with an input signal at port 181 no input voltage shall be reflected back out of port 181 and that the signals arriving at port 180 shall produce a null. In such an instance the input match to port 181 will be perfect and the directivity of the device will be infinite. This implies that $$E_{181}=E_{180}=0 \quad (8)$$

As a result of the constraints implied by equation (8), the following relationships derive $$YcR_L=RgYa \quad (9)$$

and $$R_LRg(Yb^2+YaYc)=1 \quad (10)$$

When the relationship of equations (9) and (10) to equations (5) and (7) are determined it is seen that the amplitude of the signals from the output ports of impedance transforming hybrid ring 16 are as follows:

$$E_{191}=-i\sqrt{R_LRg}\ Yb \quad (11)$$

$$E_{190}=i\,RgYa \quad (12)$$

For optimum utility of the impedance transforming hybrid ring 16 it will prove helpful if the ratio of the power division between output ports 191 and 190 is not restricted to unity but allowed to assume any desired value, K. The expression for K may then be derived as $$K=[E_{191}/E_{190}]^2=R_L/Rg(Yb/Ya)^2 \quad (13)$$

When the relationships of equations (9), (10) and (13) are determined it is seen that the characteristic admittances of ring sections 171, 172 and 173 (Ya, Yb, Yc respectively) may be set forth as follows:

$$Ya=1/Rg\sqrt{1+K} \quad (14)$$

$$Yb=\sqrt{K/R_LRg(1+K)} \quad (15)$$

and $$Yc=1/R_L\sqrt{1+K} \quad (16)$$

Application of equations (14) through (16) will provide the design of an impedance transforming ring hybrid wherein the relationship of the impedances of the input ports and the output ports is arbitrary and the ratio of the power division between output ports is determined by the choice of the designer.

For the special case where it is desired that there be an equal division of power between the output ports, $$K=1 \quad (17)$$

Design equations (14) through (16) may be written for the special case of equal power division as follows:

$$Ya=1/\sqrt{2}\ Rg \quad (18)$$

$$Yb=1/\sqrt{2RgR_L} \quad (19)$$

and $$yc=1/\sqrt{2}\ R_L \quad (20)$$

While the hybrid ring of the invention offers the advantage of inherent impedance transformation, analysis shows that its bandwidth (26 percent) is the same as that of prior art hybrid rings. However, the 26 percent bandwidth capability of the impedance transforming hybrid ring 16 represents a significant improvement over the performance of the impedance transforming branch line coupler disclosed by Ho. (See Background discussion.) When two impedance transforming hybrid rings 16 are utilized in a configuration similar to that of FIG. 2 to combine two transistors 14 there is no need for input and output impedance transforming devices 150 and 151 as were required with prior art hybrid ring 10. This represents a significant savings in design effort, cost, and package size.

Further improvements in the performance of the impedance transforming hybrid ring may be made by incorporating an essentially non-frequency sensitive phase reversal network in ring segment 173. A method is available which will permit the incorporation of such a phase reversal network and coincidently reduce the physical size of the ring structure 17 such that the four ports may be equally spaced about the ring structure.

Figure 5:
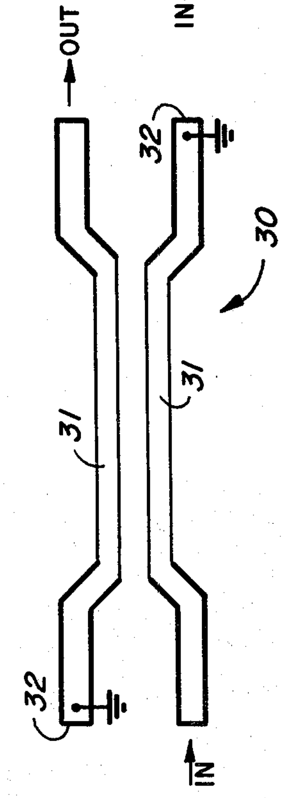
FIG. 5 is an embodiment of an ideal phase reversal network resulting from the short circuiting of a pair of diametrically opposed ends of two greater wavelength, coupled line segments.

FIG. 5 illustrates a quarter wavelength coupler 30 having two equilateral, broad side coupled segments of transmission line 31. Short circuits 32 are provided at a pair of diametrically opposed ends of coupler 30. As noted in the Background discussion the results of the embodiment illustrated in FIG. 5 is the provision of a network exhibiting the characteristics of an ideal phase reversing device. When the innovator, March, replaced the three quarter wavelength section of a conventional hybrid ring with the phase reversing network of FIG. 5 its bandwidth performance was increased to that of an octave frequency band. In addition a smaller ring structure was required since the mean diameter of the ring was reduced to two-thirds of its former diameter.

In a conventional quarter wavelength coupler such as 30 of FIG. 5 the coupled output appears at a port diametrically opposite the input port. This is indicated in FIG. 5. In many instances this displacement of the output port with respect to the input port proves an inconvenience in packaging in the device. To counteract this disadvantage Lange provided the modification illustrated in FIG. 6. J. Lange, "Interdigitated Stripline Quadrature Hybrid", IEEE Trans. on Microwave Theory and Tech., Vol. MTT-17, No. 12, pp. 1150–1151, December 1969.

Figure 6:
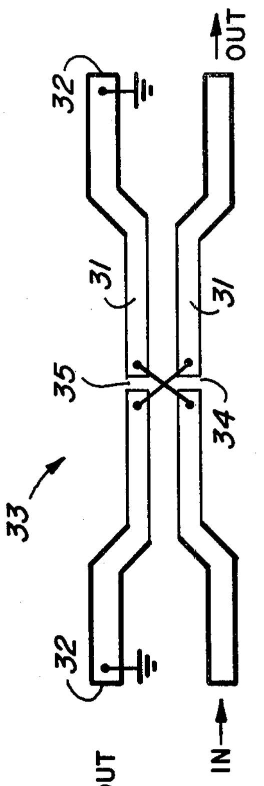
FIG. 6 illustrates the phase reversal network of FIG. 5 as modified by the use of a Lange coupler to permit the use of the short circuits on a common side of the coupled line segments.

In the Lange coupler the central section 34 of quarter wavelength couple lines 31 are open circuited and transposing conductors 35 are introduced to transpose the signal from one side of the device to the other. The result is a coupler 33 in which the input and output ports lie on the same side of the coupler device. The same modification may be made to the phase reversal network of March so that the short circuits 32 may be incorporated on a common side of the phase reversal network as illustrated in FIG. 6.

A combination of the approaches of March and Lange may be utilized with the impedance transforming hybrid ring 16 to provide an impedance transforming device of reduced size and of octave bandwidth capabilities. To do this, the characteristic admittance of ring section 173, Yc is equated to the characteristic admittance of the coupled section 31. When this is done, the even and odd mode impedances ($Z_oe$ and $Z_oo$) of the coupled segment of the phase reversal network may be defined as follows.

$$Z_{o}e = \left(\sqrt{2} + 1\right) R_L \sqrt{1 + K} \tag{21}$$

and $$Z_{o}o = \left(\sqrt{2} - 1\right) R_L \sqrt{1 + K} \tag{22}$$

As before, the special case of equal power split between output ports 190 and 191 wherein K is equal to unity, may be considered to provide the following relationships:

$$Z_{o}e = \left(2 + \sqrt{2}\right) R_L \tag{23}$$

and $$Z_{o}o = \left(2 - \sqrt{2}\right) R_L \tag{24}$$

Figure 7:
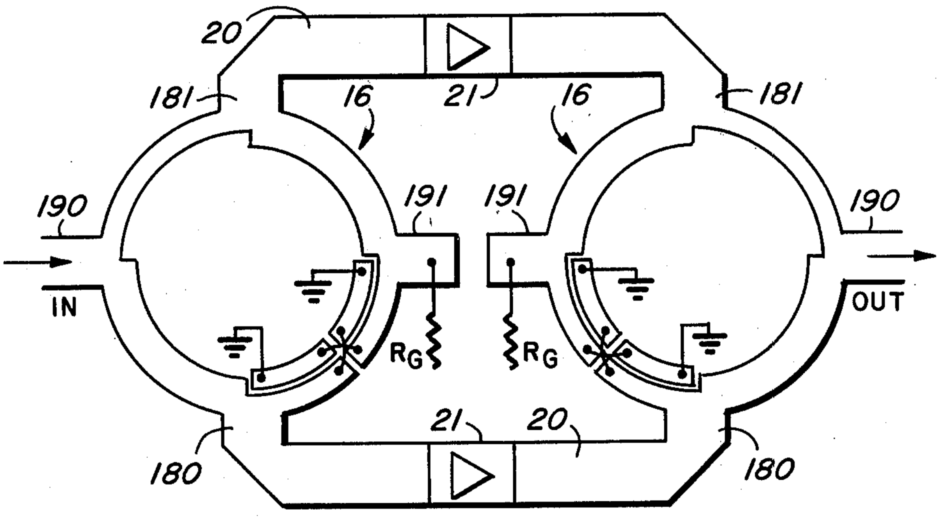
FIG. 7 is the transformerless embodiment of the transistor combining circuit of FIG. 2 utilizing the innovative hybrid rings disclosed herein.

Two such modified impedance transforming hybrid rings 16 are illustrated in FIG. 7. The two improved hybrid rings 16 are functioning in the same manner as the two conventional hybrid rings 10 illustrated schematically in FIG. 2. However, the package size is significantly reduced since the ring diameter is only two-thirds that of the prior art device due to the incorporation of the Lange modified phase reversal network of March, and the fact that transmission line sections 20 match the input and output impedances of transistor 21, which in turn are matched inherently at ports 181 and 180 of improved hybrid ring 16. No external impedance transforming devices are required. The effective frequency range of operation of the device of FIG. 7 is that of an octave bandwidth whereas that of the device of FIG. 2 utilizing prior art conventional hybrid rings is that of only a 26 percent bandwidth.

What I have disclosed is an impedance transforming hybrid ring capable of octave bandwidth performance. The impedance transforming hybrid ring is comprised of a ring structure of a non-uniform impedance. The relationship of input impedances to output impedances is arbitrary. The ratio of power division between output ports is determined by the choice of the designer. Design equations have been derived and methods for their application disclosed. While other embodiments of the improved impedance transforming hybrid ring may be derived by those skilled in the art it is intended that any modifications and embodiments differing from those of the embodiments herein chosen for exposition as fall within the spirit and scope of the invention shall be protected by the claims appended hereto.

Having described my invention in the foregoing specifications and the drawings appended thereto in such a clear, concise, understandable manner that those skilled in the art may readily and simply practice the invention, That which I claim is:

1. An impedance matching hybrid ring having a selectable power division ratio, K, between output ports comprising:

a first and a second input port;

a first and a second output port;

a non-uniform impedance ring further comprising:

a first quarter wavelength ring section having a characteristic admittance $Y_a$;

second and third quarter wavelength ring sections each having a characteristic admittance $Y_b$;

a three-quarter wavelength section having a characteristic admittance $Y_c$, said first quarter wavelength section being located between said first input port and said first output port, said second quarter wavelength section being located between said second input port and said first output port, said third quarter wavelength section being located between said first input port and said second output port, said three-quarter wavelength section being located between said second input port and said second output port; and wherein $Y_a$ is not equal to $Y_c$.

2. The hybrid ring according to claim 1 wherein the characteristic admittance of the ring sections are defined by the equations:

$$Y_a = 1/\left(R_g\sqrt{1 + K}\right);$$

$$Y_b = \sqrt{K/[R_L R_g(1 + K)]}$$

$$Y_c = 1/\left(R_L\sqrt{1 + K}\right).$$

3. The hybrid ring of claim 2 wherein said three-quarter-wavelength section of characteristic admittance Yc comprises a broad band phase-reversing network.

4. The hybrid ring of claim 3 wherein said phase-reversing network comprises short circuit means and a pair of equilateral, broadside coupled, quarter-wavelength segments having a pair of diametrically opposed ends coupled to said short-circuit means.

5. The hybrid ring of claim 3 wherein said broadside coupled segments comprise even and odd mode impedances respectively:

$$Z_{o}e = \sqrt{1 + K}\left(\sqrt{2} + 1\right) R_L; \text{ and}$$

$$Z_{o}o = \sqrt{1 + K}\left(\sqrt{2} - 1\right) R_L.$$

6. The hybrid ring of claim 5 wherein said broadside coupled quarter-wavelength segments are open circuited at central sections thereof and further comprise:

conductor means for transposing a signal from a first side to a second side of said segments and for transposing another signal from said second side to said first side of said segments.

7. The hybrid ring of claim 1 hereinafter denoted said first hybrid ring further comprising:

signal source means coupled to said first input port of said first hybrid ring;

first terminating load means coupled to said second input port of said first hybrid ring; and first and second active devices coupled respectively to said first and second output port of said first hybrid ring.

8. The hybrid ring of claim 7 further comprising a second hybrid ring having input and output ports a first and second of said second hybrid ring input ports being coupled respectively to the output of said first and second active devices and a first output port of said second hybrid ring being coupled to second terminating load means.

9. The hybrid ring of claim 8 wherein said first hybrid ring and said second hybrid ring are non-identical each to the other.

10. The hybrid ring of claim 5 hereinafter denoted said first hybrid ring further comprising:

a signal source means coupled to said first input port of said first hybrid ring;

first terminating load means coupled to said second input port of said first hybrid ring; and first and second active devices coupled respectively to said first and second output port of said first hybrid ring.

11. The hybrid ring of claim 10 further comprising a second hybrid ring having input and output ports a first and second of said second hybrid ring input ports being coupled respectively to the output of said first and second active devices and a first output port of said second hybrid ring being coupled to second terminating load means.

12. The hybrid ring of claim 11 wherein said first hybrid ring and said second hybrid ring are non-identical each to the other.

* * * * *